United States Patent
Vimercati

(10) Patent No.: US 12,237,020 B2
(45) Date of Patent: Feb. 25, 2025

(54) STORING BITS WITH CELLS IN A MEMORY DEVICE

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 381 days.

(21) Appl. No.: 17/888,298

(22) Filed: Aug. 15, 2022

(65) Prior Publication Data

US 2024/0055056 A1    Feb. 15, 2024

(51) Int. Cl.
| | | |
|---|---|---|
| *G11C 11/22* | (2006.01) | |
| *G11C 13/00* | (2006.01) | |
| *G11C 16/12* | (2006.01) | |
| *G11C 16/26* | (2006.01) | |

(52) U.S. Cl.
CPC .......... *G11C 16/26* (2013.01); *G11C 11/2259* (2013.01); *G11C 13/003* (2013.01); *G11C 13/004* (2013.01); *G11C 16/12* (2013.01)

(58) Field of Classification Search
CPC ................ G11C 16/26; G11C 11/2259; G11C 13/003; G11C 13/004; G11C 16/12; G11C 11/4091; G11C 11/4094; G11C 11/565; G11C 11/5657; G11C 11/221; G11C 11/2273
See application file for complete search history.

(56) References Cited

U.S. PATENT DOCUMENTS

| | | | |
|---|---|---|---|
| 9,899,073 B2 | 2/2018 | Kawamura | |
| 11,043,277 B1 | 6/2021 | Pellizzer | |
| 11,244,715 B1 | 2/2022 | Vimercati | |
| 11,735,249 B2 * | 8/2023 | Vimercati | G11C 11/4096 365/185.21 |
| 2008/0055958 A1 * | 3/2008 | Takemura | H10B 12/00 257/E21.654 |
| 2010/0097839 A1 * | 4/2010 | Kim | G11C 11/22 365/189.05 |
| 2012/0127776 A1 * | 5/2012 | Kawashima | G11C 11/2273 365/145 |
| 2017/0117283 A1 * | 4/2017 | Matsuzaki | G11C 16/0433 |
| 2020/0327926 A1 * | 10/2020 | Bedeschi | G11C 11/4096 |
| 2021/0304804 A1 * | 9/2021 | Vimercati | G11C 11/2255 |
| 2022/0172765 A1 * | 6/2022 | Vimercati | G11C 11/221 |

\* cited by examiner

*Primary Examiner* — Hien N Nguyen
(74) *Attorney, Agent, or Firm* — Holland & Hart LLP

(57) ABSTRACT

Methods, systems, and devices for storing bits, such as N−1 bits, with cells, such as N cells, in a memory device are described. A memory device may generate a first sensing voltage that is based on a first voltage of a first digit line and a second voltage of a second digit line. The memory device may also generate a second sensing voltage that is based on a third voltage of a third digit line and a fourth voltage of a fourth digit line. The memory device may then determine a bit value based at least in part on a difference between the first sensing voltage and the second sensing voltage.

22 Claims, 9 Drawing Sheets

STORING BITS WITH CELLS IN A MEMORY DEVICE

FIELD OF TECHNOLOGY

The following relates to one or more systems for memory, including storing N−1 bits with N cells in a memory device.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source. FeRAM may be able to achieve densities similar to volatile memory but may have non-volatile properties due to the use of a ferroelectric capacitor as a storage device.

DETAILED DESCRIPTION

In some memory systems, multiple cells may be used to store a single bit. For example, in a two-transistor two-memory cell (2TM) memory architecture, two cells may be used together to store the single bit. Using two cells to store the single bit may improve performance (e.g., reliability, latency) relative to other techniques that store, for example, one bit per cell. However, using two cells to store a single bit may reduce the capacity of a memory device relative to other techniques.

The techniques and designs described herein allow a memory device to increase capacity while retaining the performance advantages of using multiple cells to store fewer bits (instead of other techniques that store one bit per cell). Specifically, the techniques and designs described herein enable the storage of N−1 bits using N cells, where N is an integer. For example, three bits may be stored using four cells. In such an example, the first bit may be sensed based on a first pair of memory cells, the second bit may be sensed based on a second pair of memory cells, and the third bit may be sensed based on both the first pair of memory cells and the second pair of memory cells. For instance, the third bit may be sensed based on 1) a first sensing voltage that is generated from the first pair of memory cells and 2) a second sensing voltage that is generated from the second pair of memory cells. Thus, the performance advantages (e.g., improved reliability, faster sensing) of using multiple cells to store one bit may be at least partially maintained while increasing the total number of bits stored by a set of cells.

Figure 1:
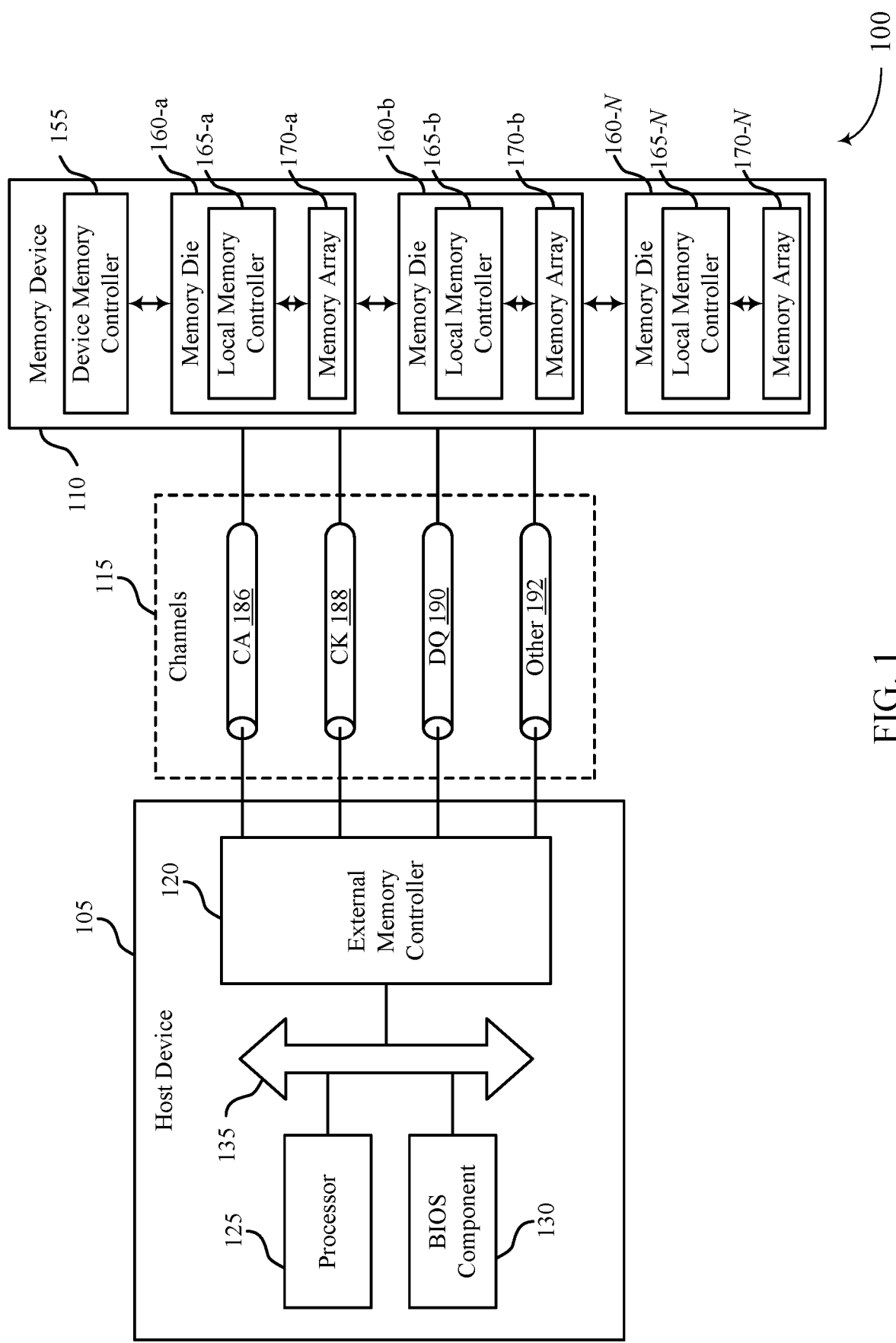
FIG. 1 illustrates an example of a system that supports storing N−1 bits with N cells in a memory device in accordance with examples as disclosed herein.
Figure 2:
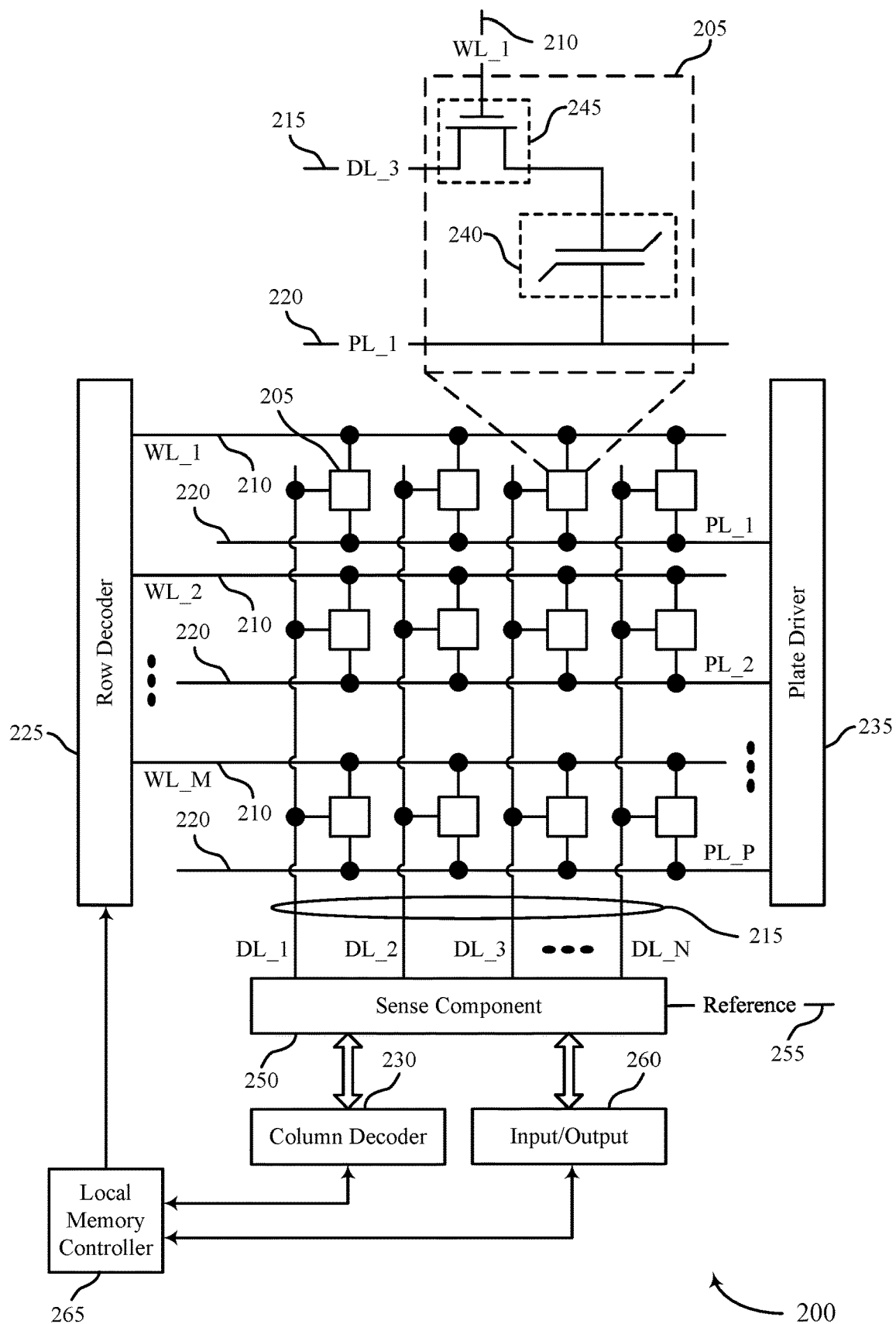
FIG. 2 illustrates an example of a memory die that supports storing N−1 bits with N cells in a memory device in accordance with examples as disclosed herein.

Features of the disclosure are initially described in the context of systems and dies with reference to FIGS. 1 and 2. Features of the disclosure are described in the context of circuits and waveform diagrams with reference to FIGS. 3 through 7. These and other features of the disclosure are further illustrated by and described with reference to an apparatus diagram and flowcharts that relate to storing N−1 bits with N cells in a memory device as described with reference to FIGS. 8 through 9.

FIG. 1 illustrates an example of a system 100 that supports storing N−1 bits with N cells in a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the memory device 110 may improve performance relative to other techniques by using multiple (e.g., two) cells to store one bit. For instance, the memory device 110 may use 2N cells to store N bits. But using two cells to store one bit may be an inefficient use of cells. According to the techniques described herein, the memory device 110 may store N−1 bits using N cells, thus improving the efficiency of the cells while maintaining performance advantages relative to techniques that store one bit per cell (e.g., techniques that use N cells to store N bits).

FIG. 2 illustrates an example of a memory die 200 that supports storing N−1 bits with N cells in a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a state (e.g., a polarization state, a dielectric charge) representative of the programmable states in a capacitor. The memory cell 205 may include a logic storage component, such as capacitor 240, and a switching component 245 (e.g., a cell selection component). A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. In FeRAM architectures, the memory cell 205 may include a capacitor 240 (e.g., a ferroelectric capacitor) that includes a ferroelectric material to store a charge (e.g., a polarization) representative of the programmable state.

The memory die 200 may include access lines (e.g., word lines 210, digit lines 215, plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding. Memory cells 205 may be positioned at intersections of the word lines 210, the digit lines 215, or the plate lines 220.

Operations such as reading and writing may be performed on memory cells 205 by activating access lines such as a word line 210, a digit line 215, or a plate line 220. By biasing a word line 210, a digit line 215, and a plate line 220 (e.g., applying a voltage to the word line 210, digit line 215, or plate line 220), a single memory cell 205 may be accessed at their intersection. The intersection of a word line 210 and a digit line 215 in a two-dimensional or in a three-dimensional configuration may be referred to as an address of a memory cell 205. Activating a word line 210, a digit line 215, or a plate line 220 may include applying a voltage to the respective line.

Accessing the memory cells 205 may be controlled through a row decoder 225, a column decoder 230, or a plate driver 235, or any combination thereof. For example, a row decoder 225 may receive a row address from the local memory controller 265 and activate a word line 210 based on the received row address. A column decoder 230 may receive a column address from the local memory controller 265 and activate a digit line 215 based on the received column address. A plate driver 235 may receive a plate address from the local memory controller 265 and activate a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that couples the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state, a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage, a reference line). The detected logic state of the memory cell 205 may be provided as an output of the sense component 250 (e.g., to an input/output 260), and may indicate the detected logic state to another component of a memory device (e.g., a memory device 110) that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 265 may generate row signals and column address signals to activate the target word line 210, the target digit line 215, and the target plate line 220. The local memory controller 265 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 265 may identify a target memory cell 205 on which to perform the write operation. The local memory controller 265 may identify a target word line 210 and a target digit line 215 coupled with the target memory cell 205 (e.g., an address of the target memory cell 205). The local memory controller 265 may activate the target word line 210 and the target digit line 215 (e.g., applying a voltage to the word line 210 or digit line 215) to access the target memory cell 205. The local memory controller 265 may apply a signal (e.g., a write pulse, a write voltage) to the digit line 215 during the write operation to store a specific state (e.g., charge) in the capacitor 240 of the memory cell 205. The signal used as part of the write operation may include one or more voltage levels over a duration.

The local memory controller 265 may be operable to perform a read operation (e.g., a sense operation) on one or more memory cells 205 of the memory die 200. During a read operation, the state (e.g., logic state, charge state, polarization state) stored in a memory cell 205 of the memory die 200 may be evaluated (e.g., read, determined, identified). The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal (e.g., charge, voltage) to the sense component 250 in response to biasing the access lines. The sense component 250 may amplify the signal. The local memory controller 265 may activate the sense component 250 (e.g., latch the sense component) and compare the signal received from the memory cell 205 to a reference (e.g., the reference 255). Based on that comparison, the sense component 250 may determine a logic state that is stored on the memory cell 205.

In some examples, the memory die 200 may improve performance and efficiency by using N cells to store N−1 bits. For example, the memory die 200 may store a first bit using a first pair of cells, may store a second bit using a second pair of cells, and may store a third bit using the first pair of cells and the second pair of cells. To sense the first bit, the memory die 200 may compare the digit line voltages of the first pair of cells. To sense the second bit, the memory die 200 may compare the digit line voltages of the second pair of cells. To sense the third bit, the memory die 200 may compare a first sensing voltage that is based on the digit line voltages of the first pair of cells with a second sensing voltage that is based on the digit line voltages of the second pair of cells. Thus, three bits may be sensed from four cells, and each bit may have two voltage components (e.g., elements) that improve sensing performance relative to other techniques.

Figure 3:
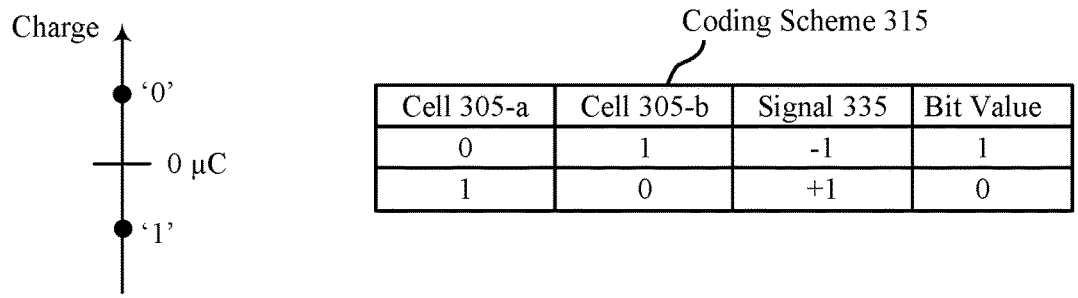
FIG. 3 illustrates an example of a circuit that supports storing N−1 bits with N cells in a memory device in accordance with examples as disclosed herein.
Figure 3:
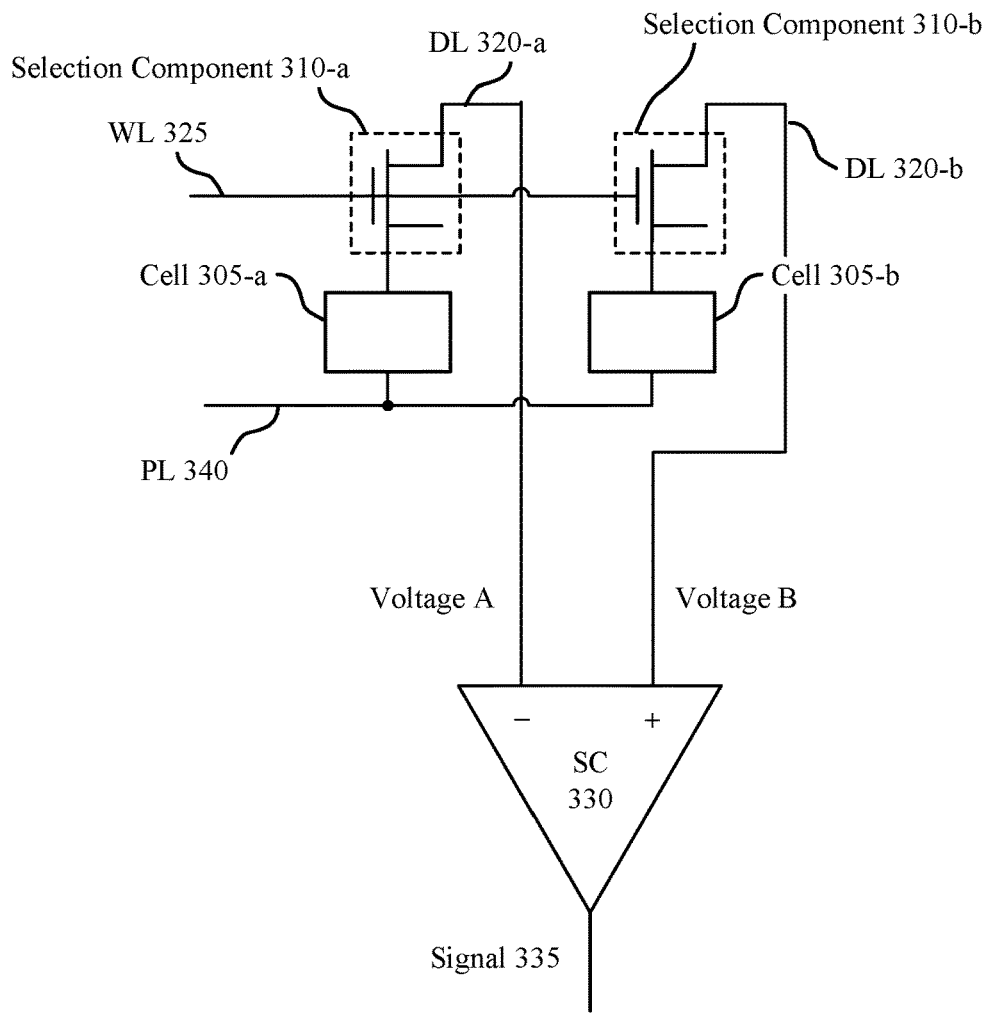

FIG. 3 illustrates an example of a circuit 300 that supports storing N−1 bits with N cells in a memory device in accordance with examples as disclosed herein. The circuit 300 may include a first cell 305-a, a second cell 305-b, a first selection component 310-a, and a second selection component 310-b arranged in a 2TM configuration. In some examples, the first cell 305-a and the second cell 305-b may be FeRAM cells. However, the techniques described herein can be implemented using other types of memory cells, including but not limited to DRAM cells.

The 2TM configuration of the cells 305 may allow for differential sensing in which the voltages output by the cells 305 are compared to each other to determine a bit value stored by the cells 305. Relative to other sensing techniques that rely on reference voltages, differential sensing using two cells may be more reliable (e.g., because the bit value is determined based on the polarity of the output signal rather than the magnitude of the output signal) and faster (e.g., because the difference between the compared voltages may be larger in differential sensing relative to techniques that rely on a reference voltage that is between programming voltages).

The selection components 310 may be configured to couple the memory cells 305 with the digit lines 320, where coupling refers to establishing a conductive path between the components. For example, the selection component 310-a may (e.g., if activated via the word line (WL) 325) couple cell 305-a with digit line (DL) 320-a. And the selection component 310-b may (e.g., if activated via the word line 325) couple cell 305-b with digit line 320-b. As shown, the selection components 310 may be coupled with the same word line (e.g., word line 325). In other examples, the selection components 310 may be coupled with respective word lines.

The cells 305 may be configured to store charge that corresponds to a value (e.g., a decimal value). For example, a cell 305 may be written to store a first amount of charge (e.g., +x micro-coulomb (μC)) that corresponds to '0' or may be written store a second amount of charge (e.g., −y μC) that corresponds to '1.' Collectively, the values stored by the cells 305 may represent a bit value. For example, according to coding scheme 315, a bit value equal to zero may be represented by cell 305-a storing a '0' and cell 305-b storing a '1,' whereas a bit value equal to one may be represented by cell 305-a storing a '1' and cell 305-b storing a '0.' A bit value may also be referred to as a data bit value or other suitable terminology.

The cells 305 may be accessed (e.g., written, read) by applying voltages to a plate line (e.g., plate line (PL) 340) coupled with the cells 305. For example, different magnitudes and/or polarities of voltage may be used to write the cells 305 to a '1' or a '0.' To read a cell 305, the voltage on the plate line 340 may be increased to a threshold value that causes the cell 305 to discharge onto the respective digit line 320 (assuming the respective word line 325 is activated). As shown, the cells 305 may be coupled with the same plate line (e.g., plate line 340). In other examples, the cells 305 may be coupled with respective plate lines.

The sense component (SC) 330 may be configured to compare input voltages and to output the difference between input voltages as a signal 335. For example, the sense component 330 may compare the voltage of digit line 320-a (denoted voltage A) and the voltage of digit line 320-b (denoted voltage B). To illustrate, the sense component 330 may subtract the input voltage at the positive terminal of the sense component 330 (e.g., voltage B) from the input voltage at the negative terminal of the sense component 330 (e.g., voltage A) and output the difference. If the difference is negative, the memory device may determine (e.g., according to the coding scheme 315) that the stored bit value is equal to one. If the difference is positive, the memory device may determine (e.g., according to the coding scheme 315) that the stored bit value is equal to zero. Thus, a bit value may be determined based on the polarity of the signal 335, regardless of the magnitude of the difference, which may improve reliability and decrease sensing latency. In some examples, the sense component 330 may be a differential sense amplifier.

So, two cells 305 may be used to store one bit value, which may provide various advantages (e.g., reliability advantages, latency advantages) relative to memory architectures that store one bit per cell. But using 2N cells to store N bit values may be an inefficient use of the memory array. According to the techniques described herein, a memory device may store N−1 bit values in N cells by using pairs of cells to store whole bit values as well as partial bit values. For example, a pair of cells that stores a first bit value may be used in conjunction with another pair of cells (which stores a second bit value) to collectively store a third bit value.

Figure 4:
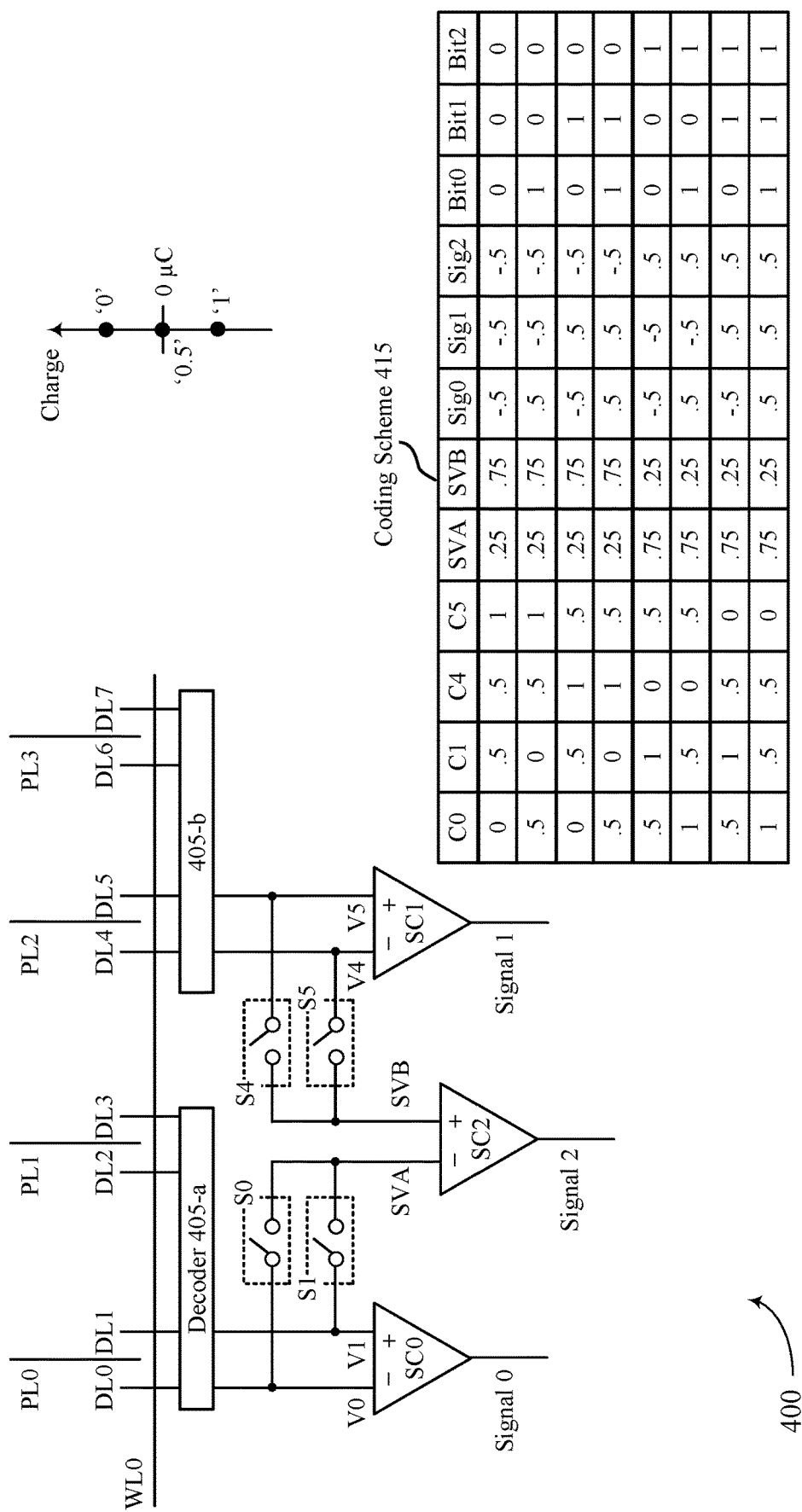
FIG. 4 illustrates an example of a circuit that supports storing N−1 bits with N cells in a memory device in accordance with examples as disclosed herein.

FIG. 4 illustrates an example of a circuit 400 that supports storing N−1 bits with N cells in a memory device in accordance with examples as disclosed herein. The circuit 400 may include digit lines DL0 through DL7 (which may be coupled with respective memory cells) and decoders 405 for selecting between digit lines for sensing. The circuit 400 may also include sense components SC0 through SC2 for sensing bit values from the memory cells and switching components S0, S1, S4, and S5 for coupling various components together to enable sensing of N−1 bit values (e.g., three bit values) using N cells (e.g., four cells). The memory cells coupled with the digit lines are omitted from the drawing for visual clarity.

The memory cells coupled with the digit lines may be arranged in 2TM configurations. For example, the circuit 400 may include a first pair of cells (cell 0 and cell 1, coupled with digit line DL0 and DL1, respectively) arranged in a 2TM configuration as illustrated and described with reference to FIG. 3. The circuit 400 may also include a second pair of cells (cell 4 and cell 5, coupled with digit line DL4 and DL5m respectively) arranged in a 2TM configuration. In some examples, the circuit 400 include additional pairs of cells arranged in 2TM configurations and coupled with DL2, DL3, DL5, and DL6. The cells may be FeRAM cells, DRAM cells, or other types of memory cells.

The circuit 400 may include word line 0 (denoted WL0) and various plate lines. Word line 0 may be coupled with the selection components of the memory cells as illustrated in FIG. 3. Plate line 0 (denoted PL0) may be coupled with the memory cells that are coupled with DL0 and DL1 (cell 0, cell 1). Plate line 1 (denoted PL1) may be coupled with the memory cells that are coupled with DL2 and DL3 (cell 2, cell 3). Plate line 2 (denoted PL2) may be coupled with the memory cells that are coupled with DL4 and DL5 (cell 4, cell 5). And plate line 3 (denoted PL3) may be coupled with the memory cells that are coupled with DL6 and DL7 (cell 6, cell 7).

The cells may be configured to store various amounts of charge that correspond to different values (e.g., a decimal values). For example, a cell may be written to store a first amount of charge (e.g., +x μC) that corresponds to '0,' may be written to store a second amount of charge (e.g., 0 μC) that corresponds to '0.5,' or may be written to store a third amount of charge (e.g., −y μC) that corresponds to '1.' Use of three programming levels (as opposed to two programming levels) may enable the storage of N−1 bits using N cells.

The values stored by the cell 0 and cell 1 (denoted C0 and C1 in the coding scheme 415) may collectively represent a first bit value (denoted Bit0), and the values stored by cell 4 and cell 5 (denoted C4 and C5) may collectively represent a second bit value (denoted Bit1). However, the third bit value (denoted Bit2) may be represented by the values collectively stored by cell 0, cell 1, cell 4, and cell 5. Compared to other coding schemes, the coding scheme 415 may maximize and equalize the voltages at the input terminals of the sense components.

The memory device may implement a first sensing operation to sense Bit0 and Bit1, and may implement a second sensing operation to sense Bit2.

To sense Bit0, the memory device may activate the word line and plate line coupled with cell 0 and cell 1 (e.g., word line 0, plate line 0) so that cell 0 and cell 1 discharge onto digit line 0 and digit line 1, respectively. Thus, voltage 0 (denoted V0) may develop on digit line 0 and voltage 1 (denoted V1) may develop on digit line 1. The memory device may then activate the sense component SC0 so that the sense component SC0 compares V0 with V1 and outputs the difference between V0 and V1 (e.g., as signal 0). If signal 0 is positive, the memory device may determine that Bit0 is equal to one; if signal 0 is negative, the memory device may determine that Bit0 is equal to zero.

To sense Bit1, the memory device may activate the word line and plate line coupled with cell 4 and cell 5 (e.g., word line 0, plate line 2) so that cell 4 and cell 5 discharge onto digit line 4 and digit line 5, respectively. Thus, voltage 4 (denoted V4) may develop on digit line 4 and voltage 5 (denoted V5) may develop on digit line 5. The memory device may then activate the sense component SC1 so that the sense component SC1 compares V4 with V5 and outputs the difference between V4 and V5 (e.g., as signal 1). If signal 1 is positive, the memory device may determine that Bit1 is a one; if signal 1 is negative, the memory device may determine that Bit1 is a zero.

To sense Bit2, the memory device may couple together digit line 0 and digit line 1 to generate sensing voltage A (denoted SVA) and may couple together digit line 4 and digit line 5 to generate sensing voltage B (denoted SVB). Thus, sensing voltage A may be a combination (e.g., average) of V0 and V1. And sensing voltage B may be a combination of V4 and V5. The memory device may sense Bit2 after sensing Bit0 and Bit1 so that coupling the digit lines together does not impact Bit0 and Bit1. Put another way, the memory device may sense Bit0 and Bit1 during a first sensing stage and may sense Bit2 during a second sensing stage after the first sensing stage. Use of DL0, DL1, DL4, and DL5 (which are non-adjacent pairs of digit lines) to store three bits (as opposed to use of DL0, DL1, DL3, and DL4, which are adjacent pairs of digit lines) may avoid electrical interference between the digit lines that may otherwise occur during sensing.

The memory device may couple together digit line 0 and digit line 1 by activating switching component S0 and switching component S1. Coupling together digit line 0 and digit line 1 may refer to establishing a conductive path between digit line 0 and digit line 1 so that charge-sharing between the digit lines can occur. Switching component S0 may be coupled with digit line 0, sense component SC0, and sense component SC2, among other components. In some examples, switching component S0 may be coupled with a first input terminal of sensing component SC0 as well as a first input terminal of sensing component SC2. Switching component S1 may be coupled with digit line 1, sense component SC0, and sense component SC2, among other components. In some examples, switching component S1 may be coupled with a second input terminal of sensing component SC0 as well as the first input terminal of sensing component SC2.

The memory device may couple together digit line 4 and digit line 5 by activating switching component S4 and switching component S5. Coupling together digit line 4 and digit line 5 may refer to establishing a conductive path between digit line 4 and digit line 5 so that charge-sharing between the digit lines can occur. Switching component S4 may be coupled with digit line 4, sense component SC1, and sense component SC2, among other components. In some examples, switching component S4 may be coupled with a first input terminal of sensing component SC1 as well as a second input terminal of sensing component SC2. Switching component S5 may be coupled with digit line 5, sense component SC1, and sense component SC2, among other components. In some examples, switching component S5 may be coupled with a second input terminal of sensing component SC0 as well as the second input terminal of sensing component SC2.

Thus, by coupling the digit lines as described, a first sensing voltage (SVA) may develop at the first input terminal of sensing component SC2 and a second sensing voltage (SVB) may develop at the second input terminal of sensing component SC2. After generating the sensing voltages, the memory device may activate the sense component SC2 so that the sense component SC2 compares SVA with SVB and outputs the difference between SVA and SVB (e.g., as signal 2). If signal 2 is positive, the memory device may determine that Bit2 is a one; if signal 2 is negative, the memory device may determine that Bit2 is a zero.

In some examples, the circuit 400 may include decoders 405 that are coupled with the digit lines and configured to selectively couple pairs of the digit lines with the sense components. For example, decoder 405-*a* may be coupled with DL0, DL1, DL2, and DL3 and may be configured to selectively couple either DL0 and DL1 or DL3 and DL4 with the sense component SC0. Similarly, decoder 405-*b* may be coupled with DL4, DL5, DL6, and DL7 and may be configured to selectively couple either DL4 and DL5 or DL6 and DL7 with the sense component SC2. In some examples, a decoder 405 may be a multiplexer (e.g., a circuit that accepts multiple input signals and outputs one of those input signals).

Thus, four memory cells (N=4) may be used to store three bits (N−1=3), which may allow the memory device to increase array efficiency while preserving advantages of a 2TM architecture.

Figure 5:
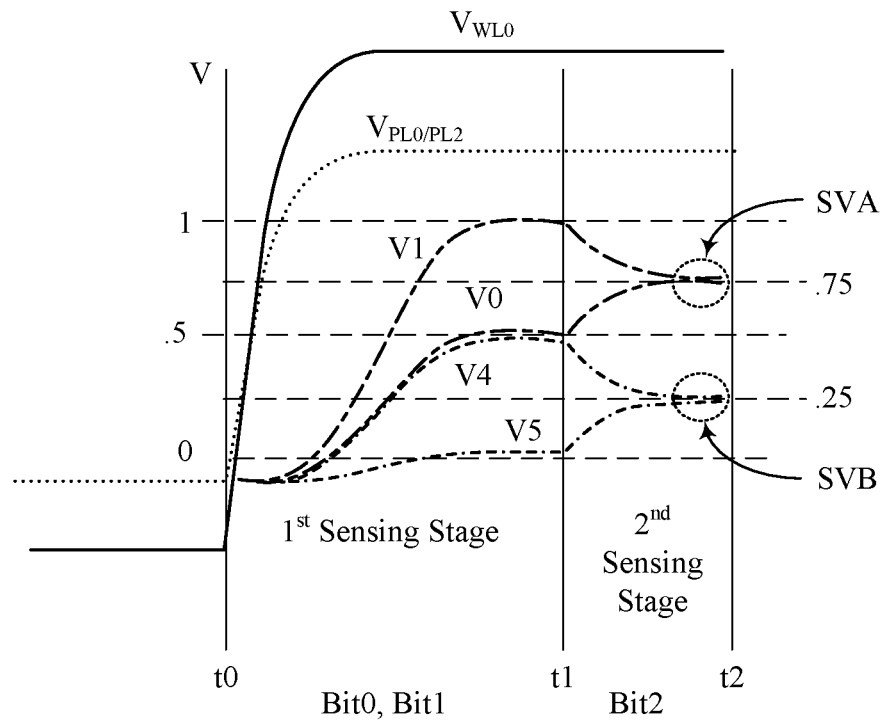
FIG. 5 illustrates an example of a waveform diagram that supports storing N−1 bits with N cells in a memory device in accordance with examples as disclosed herein.

FIG. 5 illustrates an example of a waveform diagram 500 that supports storing N−1 bits with N cells in a memory device in accordance with examples as disclosed herein. The waveform diagram 500 illustrates voltages from the circuit 400 during a sensing process to sense N−1 bit values (e.g., three bit values) from N cells (e.g., four cells). For example, the waveform diagram 500 represent voltages from sensing cells 0, 1, 4, and 5, which may store Bit0=0, Bit1=1, and Bit2=1. Two bits (Bit0, Bit1) may be sensed during a first sensing stage and one bit (Bit2) may be sensed during a second sensing stage. The voltages depicted in the waveform diagram 500 may be associated with row seven of the coding scheme 415, which is partially reproduced in FIG. 4.

The waveform diagram 500 may include word line voltage $V_{WL}$, which may be the voltage on word line 0, and plate line voltage $V_{PL}$, which may represent the respective voltages on plate line 0 and plate line 2. The waveform diagram 500 may also include the voltage on digit line 0 (V0), the voltage on digit line 1 (V1), the voltage on digit line 4 (V4), and the voltage on digit line 5 (V5). For ease of illustration, the voltage associated with '1' is shown as 1 V, the voltage associated with '0.5' is shown as 0.5 V, and the voltage associated with '0' is shown as 0 V.

At time t0, the word line voltage $V_{WL}$ may be increased to activate the selection components coupled with the cell 0, cell 1, cell 4, and cell 5. Also at time t0, the plate line voltage $V_{PL}$ may be increased so that the memory cells discharge onto respective digit lines (e.g., digit line 0, digit line 1, digit line 4, digit line 5). Thus, the voltage on digit line 0 (V0) may increase to 0.5 V, the voltage on digit line 1 (V1) may increase to 1 V, the voltage on digit line 4 (V4) may increase to 0.5 V, and the voltage on digit line 5 (V5) may increase to or stay near 0 V.

After the digit line voltages have reached equilibrium (and before time t1), sense component SC0 and sense component SC1 may be activated to sense Bit0 and Bit1. For example, sense component SC0 may compare V0 and V1 and output signal 0 (denoted Sig0) as −0.5 V based on the comparison (because V0−V1=−0.5 V). Similarly, sense component SC1 may compare V4 and V5 and output signal 1 (denoted Sig1) as +0.5 V based on the comparison (because V4−V5=+0.5 V). Accordingly, based on the coding scheme 415, the memory device may determine that Bit0=0 (because Sig0 is negative) and Bit1=1 (because Sig1 is positive). Thus, Bit0 and Bit1 may be sensed during the first sensing phase.

At time t1, the memory device may activate switching component S0 and switching component S1 to couple digit line 0 and digit line 1 with the negative input terminal of sense component SC2. Accordingly, digit line 0 and digit line 1 may charge-share causing the voltage on digit line 0 (V0) and the voltage on digit line 1 (V1) to reach equilibrium at +0.75 V (e.g., the average voltage of V0 and V1). Thus, the voltage at the negative input terminal of sense component SC2 (e.g., sensing voltage SVA) may become +0.75 V.

Also at time t1, the memory device may activate switching component S4 and switching component S5 to couple digit line 4 and digit line 5 with the positive input terminal of sense component SC2. Accordingly, digit line 5 and digit line 5 may charge-share causing the voltage on digit line 4 (V4) and the voltage on digit line 5 (V5) to reach equilibrium at +0.25 V (e.g., the average voltage of V4 and V5). Thus, the voltage at the positive input terminal of sense component SC2 (sensing voltage SVB) may become +0.25 V.

At time t2, sense component SC2 may be activated to sense Bit2. For example, sense component SC2 may compare SVA and SVB and output signal 2 (denoted Sig2) as +0.5 V based on the comparison (because SVA−SVB=+0.5 V). Accordingly, based on the coding scheme 415, the memory device may determine that Bit2=1 (because Sig2 is positive). Thus, Bit2 may be sensed during the second sensing phase.

In summary, two bits may be sensed during the first sensing phase and one bit may be sensed during the second sensing phase, which may allow three bits to be sensed from four memory cells.

Figure 6:
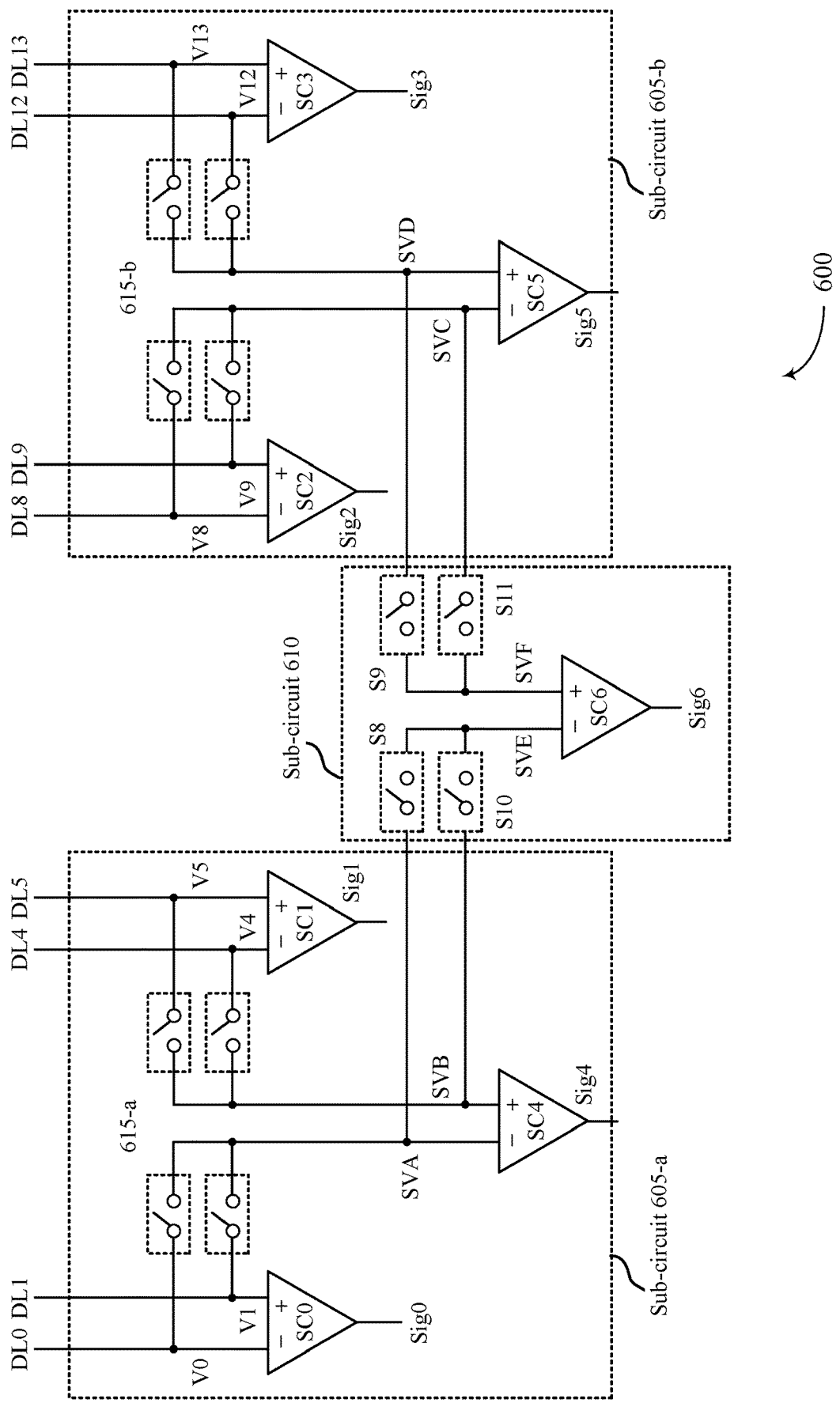
FIG. 6 illustrates an example of a circuit that supports storing N−1 bits with N cells in a memory device in accordance with examples as disclosed herein.

FIG. 6 illustrates an example of a circuit 600 that supports storing N−1 bits with N cells in a memory device in accordance with examples as disclosed herein. The circuit 600 may support sensing of N−1 bit values (e.g., seven bit values) using N cells (e.g., eight cells). The circuit 600 may include sub-circuit 605-*a* and sub-circuit 605-*b*, which may be examples of the circuit 400. The memory cells in sub-circuit 605-*a* may store three bit values (Bit0, Bit1, Bit4) and part of Bit6. The memory cells in sub-circuit 605-*b* may store three bit values (Bit2, Bit3, Bit5) and part of Bit6. The sub-circuit 610 may be used to sense the seventh bit value (Bit6).

Sub-circuit 605-*a* may operate similarly to the circuit 400 and so description of sub-circuit 605-*a* is abbreviated for concision. Sub-circuit 605-*a* may include digit lines DL0 through DL5, which may be coupled with corresponding memory cells (cell 0 through cell 5) arranged in T2M configurations. Sense component SC0 may output Sig0 (which represents Bit0) based on the voltages of digit line 0 and digit line 1 (denoted V0, V1), and sense component SC1 may output Sig1 (which represents Bit1) based on the voltages of digit line 4 and digit line 5 (denoted V4, V5). Sub-circuit 605-*a* may include switching components 615-*a* for coupling the digit lines together (and with respective input terminals of sense component SC4) so that sense component SC4 can output Sig4 (which represents Bit4) based on sensing voltage SVA and sensing voltage SVB. As described with reference to FIG. 4, sensing voltage SVA may be based on (e.g., equal to the average of) V0 and V1, whereas sensing voltage SVB may be based (e.g., equal to the average of) V4 and V5.

Sub-circuit 605-*b* may operate similarly to the circuit 400 and so description of sub-circuit 605-*b* is abbreviated for concision. Sub-circuit 605-*b* may include digit lines DL8 through DL13, which may be coupled with corresponding memory cells (cell 8 through cell 13) arranged in T2M configurations. Sense component SC2 may output Sig2 (which represents Bit2) based on the voltages of digit line 8 and digit line 9 (denoted V8, V9), and sense component SC3 may output Sig3 (which represents Bit3) based on the voltages of digit line 12 and digit line 13 (denoted V12, V13). Sub-circuit 605-*b* may include switching components 615-*b* for coupling the digit lines together (and with respective input terminals of sense component SC5) so that sense component SC5 can output Sig5 (which represents Bit5) based on sensing voltage SVC and sensing voltage SVD. As described with reference to FIG. 4, sensing voltage SVC may be based on (e.g., equal to the average of) V8 and V9, whereas sensing voltage SVD may be based (e.g., equal to the average of) V12 and V13.

Sub-circuit 410 may include switching components (S8 through S11) for coupling sense components together to generate sensing voltages (e.g., sensing voltage SVE and sensing voltage SVF) associated with Bit6. Sub-circuit 410 may also include sense component SC6 for sensing Bit6. For example, activating switching component S8 and switching component S10 may couple the input terminals of sense component SC4 together and to the negative input terminal of sense component SC6. Thus, sensing voltage SVE may be generated based on sensing voltage SVA and sensing voltage SVB. Similarly, activating switching component S9 and switching component S11 may couple the input terminals of sense component SC5 together and to the positive input terminal of sense component SC6. Thus, sensing voltage SVF may be generated based on sensing voltage SVC and sensing voltage SVD.

The sense component SC6 may compare sensing voltage SVE and sensing voltage SVF and output Sig6 based on the difference between sensing voltage SVE and sensing voltage SVF. If Sig6 is negative, the memory device may determine that Bit6 is a zero. If Sig6 is positive, the memory device may determine that Bit6 is a one. Thus, sub-circuit 605-a may be used to sense three bits (e.g., Bit0, Bit1, Bit4), sub-circuit 605-b may be used to sense three bits (e.g., Bit2, Bit3, Bit5), and sub-circuit 410 may be used to sense one bit (e.g., Bit6), for a total of seven bits.

Figure 7:
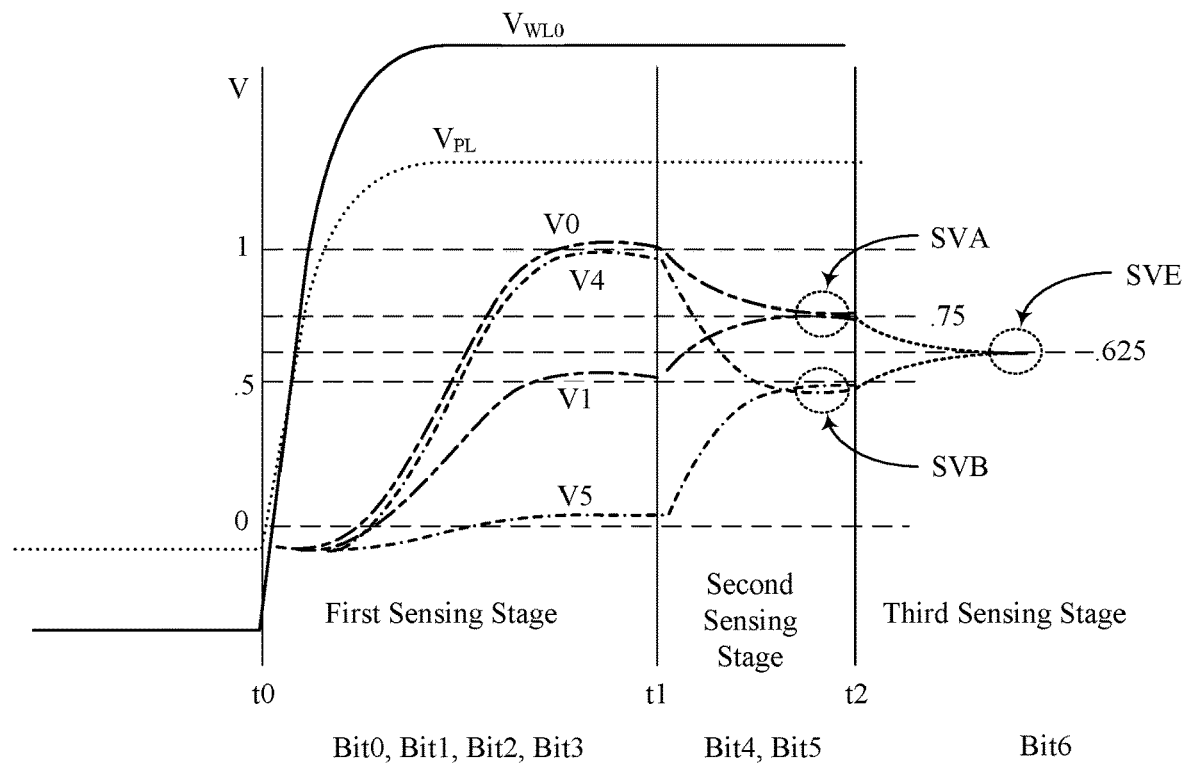
FIG. 7 illustrates an example of a waveform diagram that supports storing N−1 bits with N cells in a memory device in accordance with examples as disclosed herein.
Figure 7:
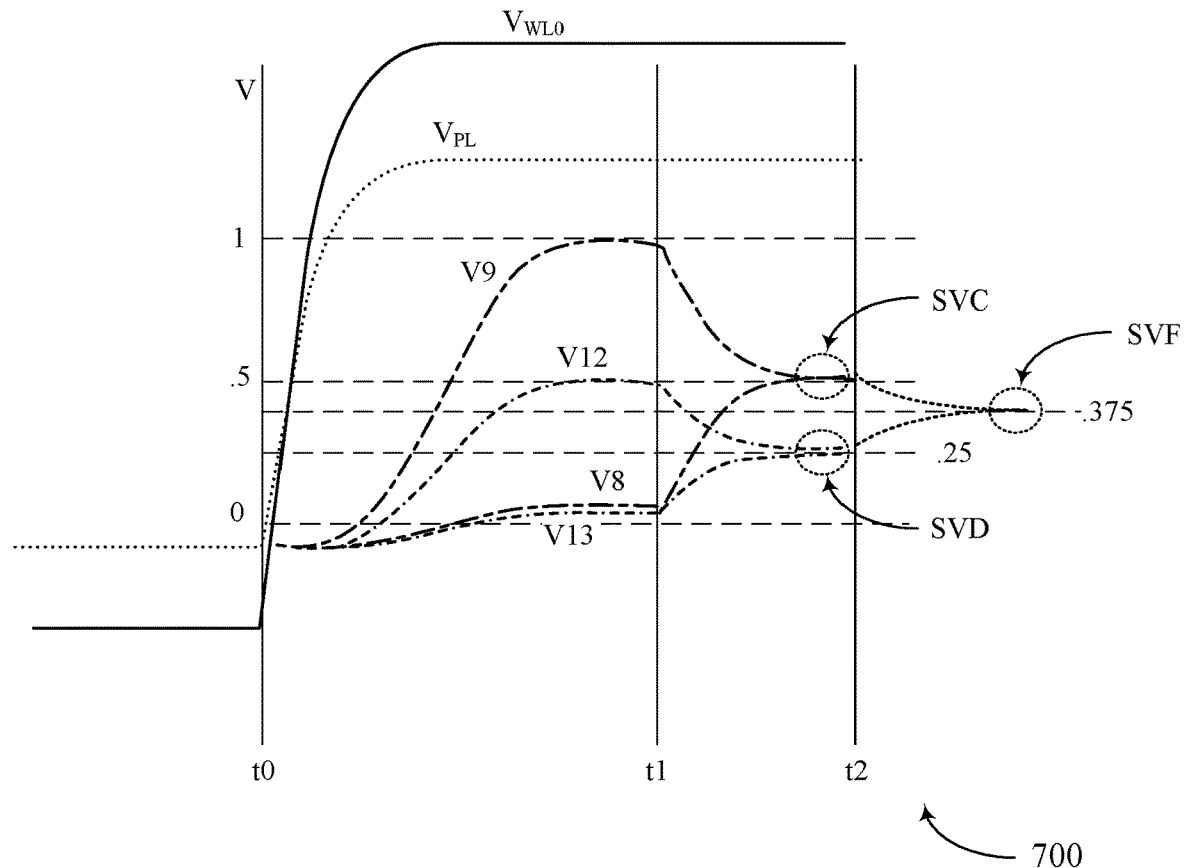

FIG. 7 illustrates an example of a waveform diagram 700 that supports storing N−1 bits with N cells in a memory device in accordance with examples as disclosed herein. The waveform diagram 700 illustrates voltages from the circuit 600 during a sensing process to sense N−1 bit values (e.g., seven bit values) from N cells (e.g., eight cells). For example, the waveform diagram 700 represent voltages from sensing cells 0, 1, 4, 5, 8, 9, 12, and 13, which may store Bit0=1, Bit1=1, Bit2=0, Bit3=1, Bit4=1, Bit5=1, and Bit6=1. Four bits (Bit0, Bit1, Bit2, Bit3) may be sensed during a first sensing stage, two bits (Bit4, Bit5) may be sensed during a second sensing stage, and one bit (Bit6) may be sensed during a third sensing stage.

The waveform diagram 700 may include word line voltage $V_{WL}$, which may be the voltage on a word line coupled with the memory cells in the circuit 600, and plate line voltage $V_{PL}$, which may represent the voltage on the plate lines coupled with the different pairs of memory cells in the circuit 600. The waveform diagram 700 may also include the voltages on the digit lines DL0, DL1, DL4, DL5, DL8, DL9, DL12, DL13 (denoted V0, V1, V4, V5, V8, V9, V12, V13, respectively). For ease of illustration, the voltage associated with '1' is shown as 1 V, the voltage associated with '0.5' is shown as 0.5 V, and the voltage associated with '0' is shown as 0 V.

At time t0, the word line voltage $V_{WL}$ may be increased to activate the selection components coupled with the cells in sub-circuit 605-a (e.g., cell 0, cell 1, cell 4, cell 5) and the cells in sub-circuit 605-b (cell 8, cell 9, cell 12, cell 13). Also at time t0, the plate line voltage(s) $V_{PL}$ may be increased so that the memory cells discharge onto respective digit lines (e.g., digit line 0, digit line 1, digit line 4, digit line 5, digit line 8, digit line 9, digit line 12, digit line 13). Thus, in sub-circuit 605-a, the voltage on digit line 0 (V0) may increase to 1 V, the voltage on digit line 1 (V1) may increase to 0.5 V, the voltage on digit line 4 (V4) may increase to 1 V, and the voltage on digit line 5 (V5) may increase to or stay near 0 V. In sub-circuit 605-b, the voltage on digit line 8 (V0) may increase or stay near 0 V, the voltage on digit line 9 (V9) may increase to 1 V, the voltage on digit line 12 (V12) may increase to 0.5 V, and the voltage on digit line 13 (V13) may increase to or stay near 0 V.

After the digit line voltages have reached equilibrium (and before time t1), sense components in sub-circuit 605-a and sub-circuit 605-b may be activated.

In sub-circuit 605-a, sense component SC0 and sense component SC1 may be activated to sense Bit0 and Bit1. For example, sense component SC0 may compare V0 and V1 and output signal 0 (denoted Sig0) as +0.5 V based on the comparison (because V0−V1=+0.5 V). Similarly, sense component SC1 may compare V4 and V5 and output signal 1 (denoted Sig1) as +1 V based on the comparison (because V4−V5=+1 V). Accordingly, the memory device may determine that Bit0=1 (because Sig0 is positive) and Bit1=1 (because Sig1 is positive).

In sub-circuit 605-b, sense component SC2 and sense component SC3 may be activated to sense Bit2 and Bit3. For example, sense component SC2 may compare V8 and V9 and output signal 2 (denoted Sig2) as −1 V based on the comparison (because V8−V9=−1 V). Similarly, sense component SC3 may compare V12 and V13 and output signal 3 (denoted Sig3) as +0.5 V based on the comparison (because V12−V13=+5 V). Accordingly, the memory device may determine that Bit2=0 (because Sig2 is negative) and Bit2=1 (because Sig3 is positive). Thus, four bits (Bit0, Bit1, Bit2, and Bit 3) may be sensed during the first sensing phase.

At time t1, the memory device may activate the switching components in sub-circuit 605-a and sub-circuit 605-b.

In sub-circuit 605-a, the memory device may activate the switching components 615-a to A) couple digit line 0 and digit line 1 with the negative input terminal of sense component SC4 and B) couple digit line 4 and digit line 5 with the positive input terminal of sense component SC4. Accordingly, digit line 0 and digit line 1 may charge-share causing the voltage at the negative input terminal of sense component SC4 (SVA) to become +0.75 V. Similarly, digit line 4 and digit line 5 may charge-share causing the voltage at the positive input terminal of sense component SC4 (SVB) to become +0.5 V.

In sub-circuit 605-b, the memory device may activate the switching components 615-b to A) couple digit line 8 and digit line 9 with the negative input terminal of sense component SC5 and B) couple digit line 12 and digit line 13 with the positive input terminal of sense component SC5. Accordingly, digit line 8 and digit line 9 may charge-share causing the voltage at the negative input terminal of sense component SC5 (SVC) to become +0.5 V. Similarly, digit line 12 and digit line 13 may charge-share causing the voltage at the positive input terminal of sense component SC5 (SVD) to become +0.25 V.

After the sensing voltages have reached equilibrium (and before time t1), sense component SC4 and sense component SC5 may be activated to sense Bit4 and Bit5. For example, sense component SC4 may compare SVA and SVB and output signal 4 (denoted Sig0) as +0.25 V based on the comparison (because SVA−SVB=+0.25 V). Similarly, sense component SC5 may compare SVC and SVD and output signal 5 (denoted Sig5) as +0.25 V based on the comparison (because SVC−SVD=+0.25 V). Accordingly, the memory device may determine that Bit4=1 (because Sig4 is positive) and Bit5=1 (because Sig5 is positive). Thus, two bits (Bit4 and Bit5) may be sensed during the second sensing phase.

At time t2, the memory device may activate the switching components in sub-circuit 410. For example, the memory device may activate switching component S8 and switching component S10 to couple the input terminals of sense component SC4 with the negative input terminal of SC6. Accordingly, the input terminals of sense component SC4 may charge-share causing the voltage at the negative input terminal of sense component SC6 (sensing voltage SVE) to become +0.625 V. Also at time t2, the memory device may activate switching component S9 and switching component S11 to couple the input terminals of sense component SC5 with the positive input terminal of SC6. Accordingly, the input terminals of sense component SC5 may charge-share causing the voltage at the positive input terminal of sense component SC6 (sensing voltage SVF) to become +0.325 V.

After the sensing voltages have reached equilibrium, sense component SC6 may be activated to sense Bit6. For example, sense component SC6 may compare SVE and SVF and output signal 6 (denoted Sig6) as +0.3 V based on the comparison (because SVE−SVF=+0.3 V). Accordingly, the memory device may determine that Bit6=1 (because Sig6 is positive). Thus, one bits (Bit6) may be sensed during the third sensing phase.

Figure 8:
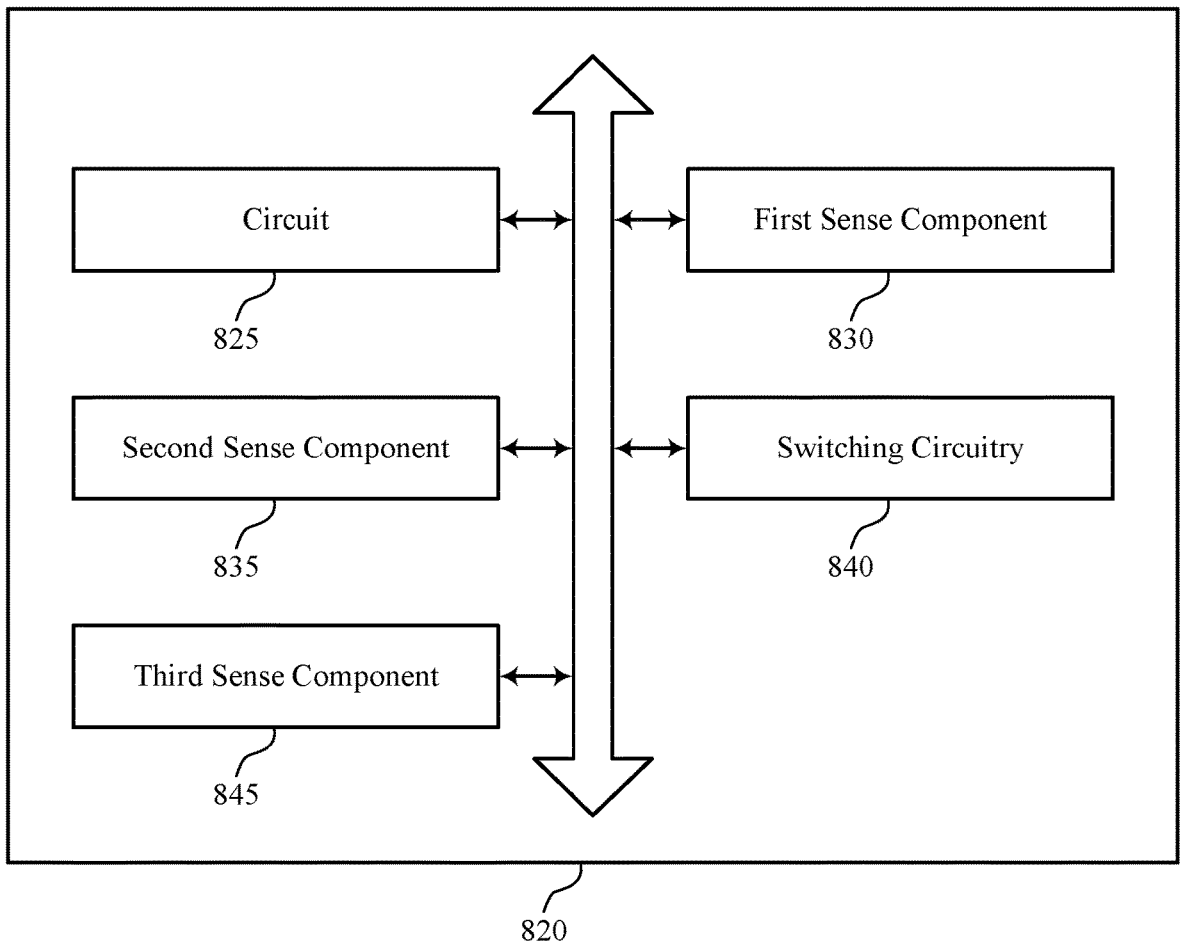
FIG. 8 shows a block diagram of a memory device that supports storing N−1 bits with N cells in a memory device in accordance with examples as disclosed herein.

FIG. 8 shows a block diagram 800 of a memory device 820 that supports storing N−1 bits with N cells in a memory device in accordance with examples as disclosed herein. The memory device 820 may be an example of aspects of a memory device as described with reference to FIGS. 1 through 7. The memory device 820, or various components thereof, may be an example of means for performing various aspects of storing N−1 bits with N cells in a memory device as described herein. For example, the memory device 820 may include a circuit 825, a first sense component 830, a second sense component 835, a switching circuitry 840, a third sense component 845, or any combination thereof. Each of these components may communicate, directly or indirectly, with one another (e.g., via one or more buses).

The circuit 825 may be configured as or otherwise support a means for generating a first sensing voltage that is based at least in part on a first voltage of a first digit line and a second voltage of a second digit line. In some examples, the circuit 825 may be configured as or otherwise support a means for generating a second sensing voltage that is based at least in part on a third voltage of a third digit line and a fourth voltage of a fourth digit line. The first sense component 830 may be configured as or otherwise support a means for determining a bit value based at least in part on a difference between the first sensing voltage and the second sensing voltage.

In some examples, the second sense component 835 may be configured as or otherwise support a means for determining a second bit value based at least in part on a difference between the first voltage of the first digit line and the second voltage of the second digit line.

In some examples, the third sense component 845 may be configured as or otherwise support a means for determining a third bit value based at least in part on a difference between the third voltage of the third digit line and the fourth voltage of the fourth digit line.

In some examples, the circuit 825 may be configured as or otherwise support a means for combining the first voltage of the first digit line with the second voltage of the second digit line, where the first sensing voltage is generated based at least in part on combining the first voltage of the first digit line with the second voltage of the second digit line.

In some examples, the circuit 825 may be configured as or otherwise support a means for combining the third voltage of the third digit line with the fourth voltage of the fourth digit line, where the second sensing voltage is generated based at least in part on combining the third voltage of the third digit line with the fourth voltage of the fourth digit line.

In some examples, the switching circuitry 840 may be configured as or otherwise support a means for coupling the first digit line with the second digit line, where the first sensing voltage is generated based at least in in part on coupling the first digit line with the second digit line. In some examples, the switching circuitry 840 may be configured as or otherwise support a means for coupling the third digit line with the fourth digit line, where the second sensing voltage is generated based at least in in part on coupling the third digit line with the fourth digit line.

In some examples, the switching circuitry 840 may be configured as or otherwise support a means for activating a first switching component coupled with a first sense component and a second sense component, where the first digit line is coupled with the second digit line based at least in part on activating the first switching component. In some examples, the switching circuitry 840 may be configured as or otherwise support a means for activating a second switching component coupled with the first sense component and the second sense component, where the first digit line is coupled with the second digit line based at least in part on activating the second switching component.

In some examples, the switching circuitry 840 may be configured as or otherwise support a means for coupling the first digit line with a first input of a sense component. In some examples, the switching circuitry 840 may be configured as or otherwise support a means for coupling the second digit line with the first input of the sense component, where the first sensing voltage is generated by at least in part on coupling the first digit line and the second digit line with the first input of the sense component.

In some examples, the switching circuitry 840 may be configured as or otherwise support a means for coupling the third digit line with a second input of the sense component. In some examples, the switching circuitry 840 may be configured as or otherwise support a means for coupling the fourth digit line with the second input of the sense component, where the second sensing voltage is generated by at least in part on coupling the third digit line and the fourth digit line with the second input of the sense component.

In some examples, the switching circuitry 840 may be configured as or otherwise support a means for coupling each of the first digit line and the second digit line with a second sense component. In some examples, the second sense component 835 may be configured as or otherwise support a means for determining, before determining the bit value, a second bit value based at least in part on coupling the first digit line and the second digit line with the second sense component.

Figure 9:
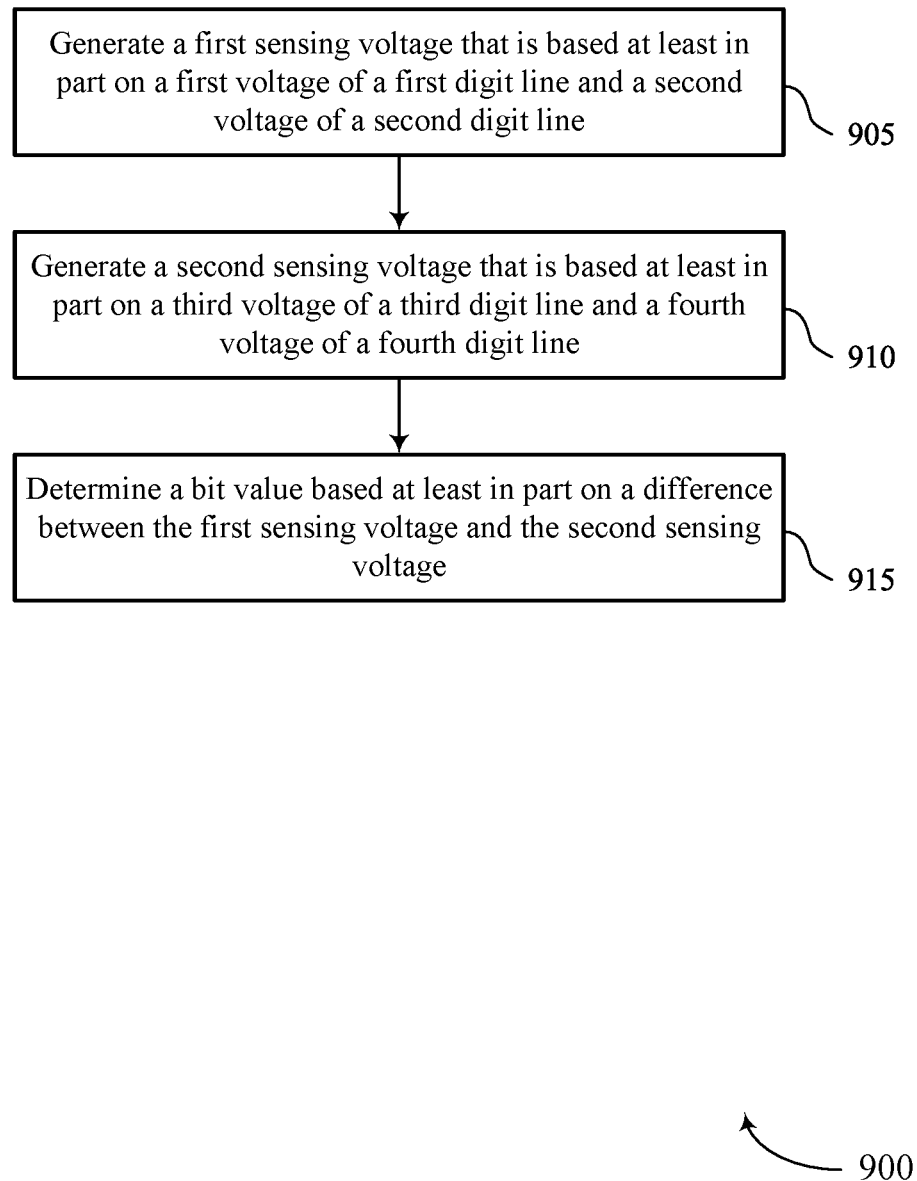
FIG. 9 shows a flowchart illustrating a method or methods that support storing N−1 bits with N cells in a memory device in accordance with examples as disclosed herein.

FIG. 9 shows a flowchart illustrating a method 900 that supports storing N−1 bits with N cells in a memory device in accordance with examples as disclosed herein. The operations of method 900 may be implemented by a memory device or its components as described herein. For example, the operations of method 900 may be performed by a memory device as described with reference to FIGS. 1 through 8. In some examples, a memory device may execute a set of instructions to control the functional elements of the device to perform the described functions. Additionally, or alternatively, the memory device may perform aspects of the described functions using special-purpose hardware.

At 905, the method may include generating a first sensing voltage (e.g., SVA) that is based at least in part on a first voltage of a first digit line and a second voltage of a second digit line. The operations of 905 may be performed in accordance with examples as disclosed herein. In some examples, aspects of the operations of 905 may be performed by a circuit 825 as described with reference to FIG. 8.

At 910, the method may include generating a second sensing voltage (e.g., SVB) that is based at least in part on a third voltage of a third digit line and a fourth voltage of a fourth digit line. The operations of 910 may be performed in accordance with examples as disclosed herein. In some examples, aspects of the operations of 910 may be performed by a circuit 825 as described with reference to FIG. 8.

At 915, the method may include determining a bit value based at least in part on a difference between the first sensing voltage and the second sensing voltage. The operations of 915 may be performed in accordance with examples as disclosed herein. In some examples, aspects of the operations of 915 may be performed by a first sense component 830 as described with reference to FIG. 8.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for generating a first sensing voltage that is based at least in part on a first voltage of a first digit line and a second voltage of a second digit line; generating a second sensing voltage that is based at least in part on a third voltage of a third digit line and a fourth voltage of a fourth digit line; and determining a bit value based at least in part on a difference between the first sensing voltage and the second sensing voltage.

Aspect 2: The method, apparatus, or non-transitory computer-readable medium of aspect 1, further including operations, features, circuitry, logic, means, or instructions, or any combination thereof for determining a second bit value based at least in part on a difference between the first voltage of the first digit line and the second voltage of the second digit line.

Aspect 3: The method, apparatus, or non-transitory computer-readable medium of aspect 2, further including operations, features, circuitry, logic, means, or instructions, or any combination thereof for determining a third bit value based at least in part on a difference between the third voltage of the third digit line and the fourth voltage of the fourth digit line.

Aspect 4: The method, apparatus, or non-transitory computer-readable medium of any of aspects 1 through 3, further including operations, features, circuitry, logic, means, or instructions, or any combination thereof for combining the first voltage of the first digit line with the second voltage of the second digit line, where the first sensing voltage is generated based at least in part on combining the first voltage of the first digit line with the second voltage of the second digit line.

Aspect 5: The method, apparatus, or non-transitory computer-readable medium of aspect 4, further including operations, features, circuitry, logic, means, or instructions, or any combination thereof for combining the third voltage of the third digit line with the fourth voltage of the fourth digit line, where the second sensing voltage is generated based at least in part on combining the third voltage of the third digit line with the fourth voltage of the fourth digit line.

Aspect 6: The method, apparatus, or non-transitory computer-readable medium of any of aspects 1 through 5, further including operations, features, circuitry, logic, means, or instructions, or any combination thereof for coupling the first digit line with the second digit line, where the first sensing voltage is generated based at least in in part on coupling the first digit line with the second digit line and coupling the third digit line with the fourth digit line, where the second sensing voltage is generated based at least in in part on coupling the third digit line with the fourth digit line.

Aspect 7: The method, apparatus, or non-transitory computer-readable medium of aspect 6, further including operations, features, circuitry, logic, means, or instructions, or any combination thereof for activating a first switching component coupled with a first sense component and a second sense component, where the first digit line is coupled with the second digit line based at least in part on activating the first switching component and activating a second switching component coupled with the first sense component and the second sense component, where the first digit line is coupled with the second digit line based at least in part on activating the second switching component.

Aspect 8: The method, apparatus, or non-transitory computer-readable medium of any of aspects 1 through 7, further including operations, features, circuitry, logic, means, or instructions, or any combination thereof for coupling the first digit line with a first input of a sense component and coupling the second digit line with the first input of the sense component, where the first sensing voltage is generated by at least in part on coupling the first digit line and the second digit line with the first input of the sense component.

Aspect 9: The method, apparatus, or non-transitory computer-readable medium of aspect 8, further including operations, features, circuitry, logic, means, or instructions, or any combination thereof for coupling the third digit line with a second input of the sense component and coupling the fourth digit line with the second input of the sense component, where the second sensing voltage is generated by at least in part on coupling the third digit line and the fourth digit line with the second input of the sense component.

Aspect 10: The method, apparatus, or non-transitory computer-readable medium of any of aspects 8 through 9, further including operations, features, circuitry, logic, means, or instructions, or any combination thereof for coupling each of the first digit line and the second digit line with a second sense component and determining, before determining the bit value, a second bit value based at least in part on coupling the first digit line and the second digit line with the second sense component.

It should be noted that the methods described herein are possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 11: An apparatus, including: a first switching component coupled with a first digit line and configured to couple the first digit line with a second digit line and a first input of a sense component; a second switching component coupled with the second digit line and configured to couple the second digit line with the first digit line and the first input of the sense component; a third switching component coupled with a third digit line and configured to couple the third digit line with a fourth digit line and with a second input of the sense component; and a fourth switching component coupled with the fourth digit line and configured to couple the fourth digit line with the third digit line and the second input of the sense component.

Aspect 12: The apparatus of aspect 11, further including: the sense component configured to compare a first sensing voltage that is generated based at least in part on coupling the first digit line with the second digit line and a second sensing voltage that is generated based at least in part on coupling the third digit line with the fourth digit line.

Aspect 13: The apparatus of aspect 12, further including: a second sense component coupled with the first digit line and the second digit line and configured to compare a first voltage of the first digit line with a second voltage of the second digit line; and a third sense component coupled with the third digit line and the fourth digit line and configured to compare a third voltage of the third digit line with a fourth voltage of the fourth digit line.

Aspect 14: The apparatus of any of aspects 11 through 13, further including: a second sense component including a first input coupled with the first switching component and including a second input coupled with the second switching component.

Aspect 15: The apparatus of aspect 14, further including: a third sense component including a first input coupled with the third switching component and including a second input coupled with the fourth switching component.

Aspect 16: The apparatus of any of aspects 11 through 15, further including: a first sense component coupled with a second sense component via the first switching component and the second switching component and coupled with a third sense component via the third switching component and the fourth switching component.

Aspect 17: The apparatus of any of aspects 11 through 16, further including: a first selection component coupled with the first digit line; a second selection component coupled with the second digit line; and a first word line coupled with the first selection component and the second selection component.

Aspect 18: The apparatus of any of aspects 11 through 17, further including: a first memory cell coupled with the first digit line; a second memory cell coupled with the second digit line; and a first plate line coupled with the first memory cell and the second memory cell.

An apparatus is described. The following provides an overview of aspects of the apparatus as described herein:

Aspect 19: An apparatus, including: a memory array including a first memory cell coupled with a first digit line, a second memory cell coupled with a second digit line, a third memory cell coupled with a third digit line, and a fourth memory cell coupled with a fourth digit line; and a controller coupled with the memory array and configured to cause the apparatus to: generate a first sensing voltage that is based at least in part on a first voltage of the first digit line and a second voltage of the second digit line; generate a second sensing voltage that is based at least in part on a third voltage of the third digit line and a fourth voltage of the fourth digit line; and determine a bit value based at least in part on a difference between the first sensing voltage and the second sensing voltage.

Aspect 20: The apparatus of aspect 19, where the controller is further configured to cause the apparatus to: determine a second bit value based at least in part on a difference between the first voltage of the first digit line and the second voltage of the second digit line; and determine a third bit value based at least in part on a difference between the third voltage of the third digit line and the fourth voltage of the fourth digit line.

Aspect 21: The apparatus of any of aspects 19 through 20, where the controller is further configured to cause the apparatus to: couple the first digit line with the second digit line, where the first sensing voltage is generated based at least in in part on coupling the first digit line with the second digit line; and couple the third digit line with the fourth digit line, where the second sensing voltage is generated based at least in in part on coupling the third digit line with the fourth digit line.

Aspect 22: The apparatus of any of aspects 19 through 21, where the controller is further configured to cause the apparatus to: couple the first digit line with a first input of a sense component; and couple the second digit line with the first input of the sense component, where the first sensing voltage is generated by at least in part on coupling the first digit line and the second digit line with the first input of the sense component.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   generating a first sensing voltage that is based at least in part on a first voltage of a first digit line and a second voltage of a second digit line;
   generating a second sensing voltage that is based at least in part on a third voltage of a third digit line and a fourth voltage of a fourth digit line; and
   determining a bit value based at least in part on a difference between the first sensing voltage and the second sensing voltage.

2. The method of claim 1, further comprising:
   determining a second bit value based at least in part on a difference between the first voltage of the first digit line and the second voltage of the second digit line.

3. The method of claim 2, further comprising:
   determining a third bit value based at least in part on a difference between the third voltage of the third digit line and the fourth voltage of the fourth digit line.

4. The method of claim 1, further comprising:
   combining the first voltage of the first digit line with the second voltage of the second digit line, wherein the first sensing voltage is generated based at least in part on combining the first voltage of the first digit line with the second voltage of the second digit line.

5. The method of claim 4, further comprising:
   combining the third voltage of the third digit line with the fourth voltage of the fourth digit line, wherein the second sensing voltage is generated based at least in part on combining the third voltage of the third digit line with the fourth voltage of the fourth digit line.

6. The method of claim 1, further comprising:
   coupling the first digit line with the second digit line, wherein the first sensing voltage is generated based at least in in part on coupling the first digit line with the second digit line; and
   coupling the third digit line with the fourth digit line, wherein the second sensing voltage is generated at least in in part on coupling the third digit line with the fourth digit line.

7. The method of claim 6, further comprising:
   activating a first switching component coupled with a first sense component and a second sense component, wherein the first digit line is coupled with the second digit line based at least in part on activating the first switching component; and
   activating a second switching component coupled with the first sense component and the second sense component, wherein the first digit line is coupled with the second digit line based at least in part on activating the second switching component.

8. The method of claim 1, further comprising:
   coupling the first digit line with a first input of a sense component; and
   coupling the second digit line with the first input of the sense component, wherein the first sensing voltage is generated by at least in part on coupling the first digit line and the second digit line with the first input of the sense component.

9. The method of claim 8, further comprising:
   coupling the third digit line with a second input of the sense component; and
   coupling the fourth digit line with the second input of the sense component, wherein the second sensing voltage is generated by at least in part on coupling the third digit line and the fourth digit line with the second input of the sense component.

10. The method of claim 8, further comprising:
    coupling each of the first digit line and the second digit line with a second sense component; and
    determining, before determining the bit value, a second bit value based at least in part on coupling the first digit line and the second digit line with the second sense component.

11. An apparatus, comprising:
    a first switching component coupled with a first digit line and configured to couple the first digit line with a second digit line and a first input of a sense component;
    a second switching component coupled with the second digit line and configured to couple the second digit line with the first digit line and the first input of the sense component;
    a third switching component coupled with a third digit line and configured to couple the third digit line with a fourth digit line and with a second input of the sense component; and
    a fourth switching component coupled with the fourth digit line and configured to couple the fourth digit line with the third digit line and the second input of the sense component.

12. The apparatus of claim 11, further comprising:
    the sense component configured to compare a first sensing voltage that is generated based at least in part on coupling the first digit line with the second digit line and a second sensing voltage that is generated based at least in part on coupling the third digit line with the fourth digit line.

13. The apparatus of claim 12, further comprising:
    a second sense component coupled with the first digit line and the second digit line and configured to compare a first voltage of the first digit line with a second voltage of the second digit line; and
    a third sense component coupled with the third digit line and the fourth digit line and configured to compare a third voltage of the third digit line with a fourth voltage of the fourth digit line.

14. The apparatus of claim 11, further comprising:
    a second sense component comprising a first input coupled with the first switching component and comprising a second input coupled with the second switching component.

15. The apparatus of claim 14, further comprising:
a third sense component comprising a first input coupled with the third switching component and comprising a second input coupled with the fourth switching component.

16. The apparatus of claim 11, further comprising:
a first sense component coupled with a second sense component via the first switching component and the second switching component and coupled with a third sense component via the third switching component and the fourth switching component.

17. The apparatus of claim 11, further comprising:
a first selection component coupled with the first digit line;
a second selection component coupled with the second digit line; and
a first word line coupled with the first selection component and the second selection component.

18. The apparatus of claim 11, further comprising:
a first memory cell coupled with the first digit line;
a second memory cell coupled with the second digit line; and
a first plate line coupled with the first memory cell and the second memory cell.

19. An apparatus, comprising:
a memory array comprising a first memory cell coupled with a first digit line, a second memory cell coupled with a second digit line, a third memory cell coupled with a third digit line, and a fourth memory cell coupled with a fourth digit line; and
a controller coupled with the memory array and configured to cause the apparatus to:
generate a first sensing voltage that is based at least in part on a first voltage of the first digit line and a second voltage of the second digit line;
generate a second sensing voltage that is based at least in part on a third voltage of the third digit line and a fourth voltage of the fourth digit line; and
determine a bit value based at least in part on a difference between the first sensing voltage and the second sensing voltage.

20. The apparatus of claim 19, wherein the controller is further configured to cause the apparatus to:
determine a second bit value based at least in part on a difference between the first voltage of the first digit line and the second voltage of the second digit line; and
determine a third bit value based at least in part on a difference between the third voltage of the third digit line and the fourth voltage of the fourth digit line.

21. The apparatus of claim 19, wherein the controller is further configured to cause the apparatus to:
couple the first digit line with the second digit line, wherein the first sensing voltage is generated based at least in in part on coupling the first digit line with the second digit line; and
couple the third digit line with the fourth digit line, wherein the second sensing voltage is generated based at least in in part on coupling the third digit line with the fourth digit line.

22. The apparatus of claim 19, wherein the controller is further configured to cause the apparatus to:
couple the first digit line with a first input of a sense component; and
couple the second digit line with the first input of the sense component, wherein the first sensing voltage is generated by at least in part on coupling the first digit line and the second digit line with the first input of the sense component.

* * * * *